(12) United States Patent
Lin et al.

(10) Patent No.: US 7,919,216 B2
(45) Date of Patent: Apr. 5, 2011

(54) MASK AND DESIGN METHOD THEREOF

(75) Inventors: Chia-Wei Lin, Taipei (TW); Teng-Yen Huang, Taipei (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 210 days.

(21) Appl. No.: 12/270,566

(22) Filed: Nov. 13, 2008

(65) Prior Publication Data

US 2009/0220868 A1 Sep. 3, 2009

(30) Foreign Application Priority Data

Feb. 29, 2008 (TW) .............................. 97107207 A

(51) Int. Cl.
*G03F 1/00* (2006.01)

(52) U.S. Cl. .......................................................... 430/5
(58) Field of Classification Search ........................ 430/5
See application file for complete search history.

(56) References Cited

U.S. PATENT DOCUMENTS

| | | | | |
|---|---|---|---|---|
| 2006/0006485 A1* | 1/2006 | Mouli | ............................ | 257/432 |
| 2006/0029349 A1* | 2/2006 | Hoshi et al. | .................... | 385/129 |
| 2006/0210888 A1* | 9/2006 | Taniguchi | ........................ | 430/5 |
| 2007/0025682 A1* | 2/2007 | Takagi et al. | ................. | 385/147 |

* cited by examiner

*Primary Examiner* — Stephen Rosasco
*Assistant Examiner* — Jonathan Jelsma
(74) *Attorney, Agent, or Firm* — Volpe and Koenig, P.C.

(57) ABSTRACT

A mask and the design method thereof are provided. The mask includes a light-shielding area shielding off a light, wherein the light-shielding area includes a photonic crystal having a lattice constant, and a ratio of the lattice constant to a wavelength of the light is a specific value within a band gap of the photonic crystal.

10 Claims, 10 Drawing Sheets

MASK AND DESIGN METHOD THEREOF

FIELD OF THE INVENTION

The present preferred embodiment is related to a mask and the design method thereof, and more particularly to a light-shielding area of the mask, which is used for an exposing system of a semiconductor manufacturing process.

BACKGROUND OF THE INVENTION

There are numerous researches and inventions for improving semiconductor manufacturing technology nowadays. The photolithography process is necessary for patterning a semiconductor element and has become a bottleneck of the semiconductor process due to the continuously demanding of decreasing the semiconductor element size. That is to say, the semiconductor manufacturing technology will be hindered if the difficulties caused by implementing the photolithography technology cannot be overcome.

According to Rayleigh criterion, the minimum width, i.e. the resolution of the pattern, capable of being recognized by an optical system is directly proportional to the wavelength ($\lambda$) of a light and inversely proportional to the numerical aperture (NA). Therefore, in theory, both of the shorter wavelength of exposing light and bigger NA of lenses are conceivable to increase the resolution to obtain narrower width. However, the problems such as the shortening of the depth of focus (DOF) shall be considered. Currently, the Resolution Enhancement Technology (RET) commonly used in the photolithography process comprises Off-Axis Illumination (OAI), Phase Shift Mask (PSM), and Optical Proximity Correction (OPC).

A light passing through a mask will generate a diffraction effect when the line width is close to the wavelength of the light, and accumulation of the diffraction light will result in a serious distortion in the exposed patterns. The OPC technology compensates the distortion caused by diffraction effect and amends the patterns on the mask to enable the accumulated diffraction light to coincide with the required patterns and widths. However, the aforementioned technology still has drawbacks, such as increasing complexity of the mask and a high cost of the whole process.

Furthermore, when the development of the semiconductor manufacturing process comes to 45 nanometer or even a smaller size generation, an Extreme Ultra-Violet (EUV) may be adopted as a new light source, which is not necessary to use OPC or other RETs. However, high cost of the mask substrate as a glass with 40 layers of molybdenum and silicon and the capacity for producing a perfect mask substrate are heavy challenges.

In order to overcome the mentioned drawbacks in the prior art, a mask and the design method thereof are provided in the present preferred embodiment.

SUMMARY OF THE INVENTION

In accordance with one aspect of the present preferred embodiment, a mask is provided and comprises a light-shielding area. The light-shielding area comprises a photonic crystal having a lattice constant, and a ratio of the lattice constant to a wavelength of the light is a specific value within a band gap of the photonic crystal.

Preferably, the photonic crystal comprises a plurality of photonic crystal cells, each of which has a surface receiving the light and comprises a first dielectric and a second dielectric, and usually the permittivity of the first dielectric is different from that of the second dielectric.

When each photonic crystal cell has a specific shape, a specific geometric ratio, and suitable materials respectively for the first and the second dielectrics, it is conceivable to obtain a photonic band structure and a band gap of the photonic crystal. If we adjust a light to be a transverse electric (TE) wave or a transverse magnetic (TM) wave, and set wavelength of the light to make the frequency of the light to fall in a range of the band gap, the light will be shielded by the light-shielding area formed by the plurality of photonic crystal cells.

For example, when the surface is square-shaped and the first dielectric is cylindrical, i.e. the second dielectric surrounds the cylindrical first dielectric to form a square-shaped photonic crystal cell, the light may be a TE wave and the specific value will be in a range of 0.3301 to 0.451.

Furthermore, when the surface is rectangular-shaped and the first dielectric comprises a plurality of cuboids, the light may be a TE wave and the specific value will be in a range of 0.5455 to 0.5988. Alternatively, the light may be a TM wave and the specific value will be in a range of 0.4212 to 0.4642.

Furthermore, when the surface is triangular-shaped and the second dielectrics of the plurality of photonic crystal cells form a plurality of cylinders, the light may be a TM wave and the specific value is in a range of 0.3213 to 0.5049. Besides, the light may be either of a TM wave and a TE wave when the specific value is in a range of 0.4207 to 0.4709.

Morefore, when the surface is hexagon-shaped and the first dielectric is cylindrical, the light may either be a TM wave or a TE wave when the specific value is in a range selected from one of 0.4088 to 0.4322 and 0.4886 to 0.5364.

Preferably, the material for making the first dielectric may be selected from the group consisting of metal, silicon and a combination thereof, and the material for the second dielectric may be air. However, it is to be noted that any two different materials, each having respective permittivity and periodically disposed to form a photonic crystal having a band gap, may be adopted to form the light-shielding area of the mask in the present preferred embodiment.

In accordance with another aspect of the present preferred embodiment, a mask is provided, which comprises a light-shielding area. The light-shielding area comprises a plurality of photonic crystal cells, each of which has a specific shape.

Preferably, the plurality of photonic crystal cells are disposed in square lattices to constitute a cylindrical photonic crystal system.

Preferably, the plurality of photonic crystal cells are disposed in rectangular lattices to constitute a checker photonic crystal system.

Preferably, the plurality of photonic crystal cells are disposed in triangular lattices to constitute a cylindrical photonic crystal system.

Preferably, the plurality of photonic crystal cells are disposed in hexagonal lattices to constitute a cylindrical photonic crystal system.

In accordance with a further aspect of the present preferred embodiment, a method for designing a mask is provided, which comprises providing a substrate; disposing a light-shielding area on the substrate; and disposing a plurality of photonic crystal cells in the light-shielding area, wherein each of the photonic crystal cells has a specific shape.

Preferably, the specific shape is one selected from a group consisting of a cube, a parallelepiped, a hexagonal prism and a triangular prism.

Preferably, the method for designing a mask further comprises obtaining a band gap of the plurality of photonic crystal cells; setting a wavelength of a light shielded off by the light-shielding area; and defining a lattice constant of the plurality of photonic crystal cells based on the band gap and the wavelength. Therefore, when we adjust the polarization direction and the wavelength of an exposing light to make the frequency of the light fall in a range of the band gap, the light will be shielded off by the light-shielding area formed by the plurality of photonic crystal cells.

Preferably, the mask provided in the present preferred embodiment is used for a photolithography process of a semi-conductor element, and an exposing light of the photolithography process may be an Extreme Ultra-Violet light.

Based on the above, the mask having light-shielding area formed by photonic crystal is provided in the present preferred embodiment. An exposing light of the photolithography process will accurately and precisely pass through the light-passing area of the mask by disposing a plurality of specific-shaped photonic crystal cells in the light-shielding area, obtaining the photonic band structure and a band gap of the photonic crystal from the data of the specific shape, a specific geometric ratio of the shape and permittivity of materials of the photonic crystal cell, and adjusting the polarization direction and the frequency of the exposing light. Therefore, not only does the present preferred embodiment solve the drawbacks of the conventional masks used for the semiconductor manufacturing process, also it is not necessary to use OPC or other RETs to overcome the diffraction effect in the photolithography process.

The present preferred embodiment may best be understood through the following descriptions with reference to the accompanying drawings, wherein:

DETAILED DESCRIPTION OF THE PREFERRED EMBODIMENT

The present preferred embodiment will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
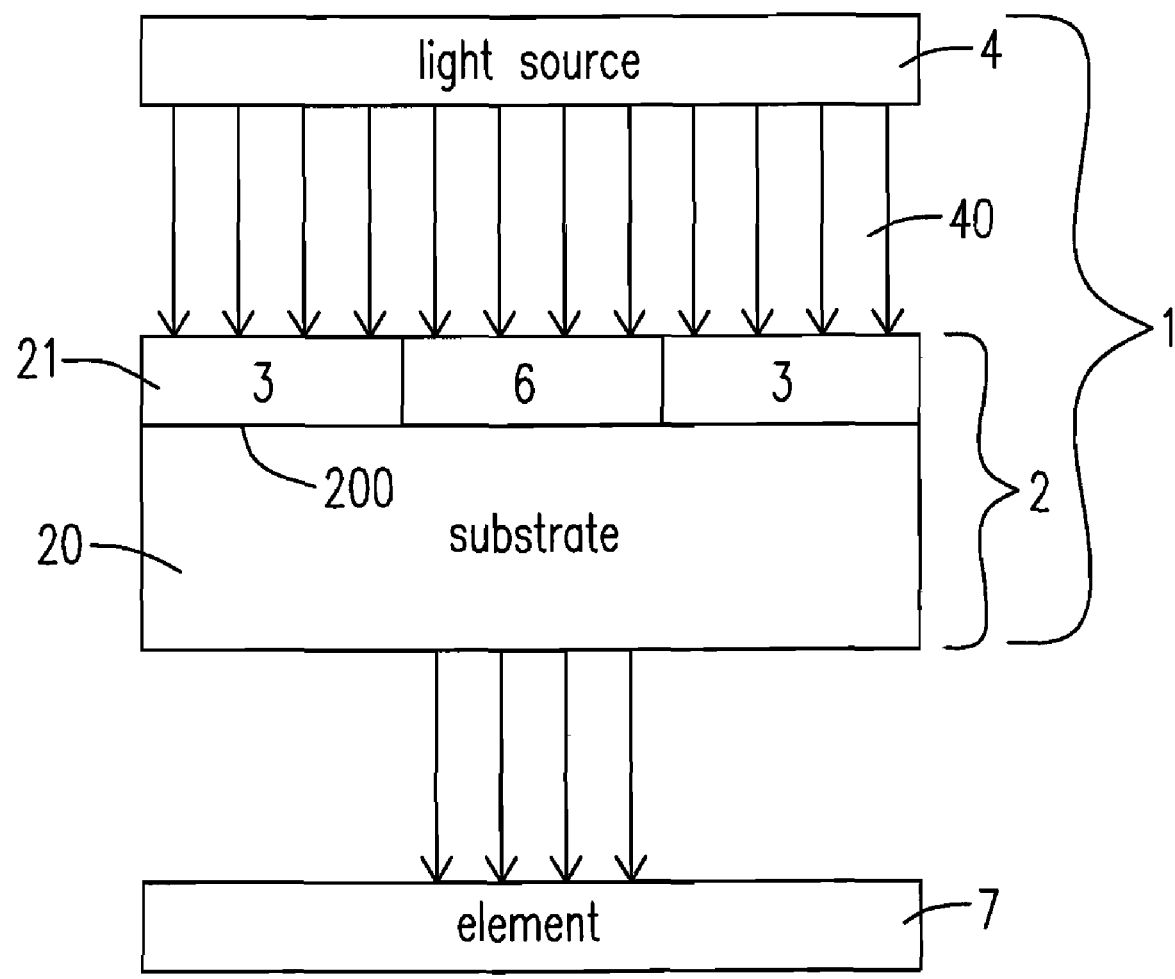
FIG. 1 is a diagram showing a mask in the present preferred embodiment being used in an exposing system.

Please refer to FIG. 1, showing a mask in the present preferred embodiment being used in an exposing system. The exposing system 1 comprises a light source 4 and a mask 2 and is used for transferring a pattern 21 on the mask 2 to an element 7. The light source 4 generates an exposing light 40, and the mask 2 comprises a substrate 20 and the pattern 21 disposed in a surface 200 of the substrate 20. The pattern 21 comprises a light-shielding area 3 and a light-passing area 6, wherein the light-shielding area 3 is formed by photonic crystal, and a ratio of a lattice constant (a) of the photonic crystal to a wavelength ($\lambda$) of the exposing light 40 is set within a band gap of the photonic crystal. Therefore, the exposing light 40 cannot pass through the light-shielding area 3. It is to be noted that the photonic crystal in the mentioned embodiment is a two-dimension photonic crystal, but in practice the photonic crystal may be a one-dimension or a three-dimension photonic crystal. That is to say, any kinds of photonic crystal having a band gap may be adopted as the light-shielding area 3 of the mask 2 via controlling the ratio of the lattice constant (a) to the wavelength ($\lambda$) of the exposing light 40.

According to the mentioned embodiment, the light-shielding area 3 formed by photonic crystal is configured to be a circuit pattern of the pattern 21 which will be transferred to the element 7, and in practice it may be the portion of non-circuit pattern. The element 7 is a semiconductor element such as an IC chip. It is to be noted that the exposing system 1 shown in FIG. 1 is a simple diagram without being drawn in real proportion and leaving out some equipments such as condenser lenses or object lenses.

According to the mentioned embodiment, in addition to setting the wavelength ($\lambda$) of the exposing light 40, the light source 4 further adjusts a polarization direction of the exposing light 40 to be a TE wave or a TM wave. During a photolithography process using the exposing system 1, the wavelength ($\lambda$) and the polarization direction of the exposing light 40 will be determined based on the lattice constant and the geometric shape/ratio of the photonic crystal forming the light-shielding area 3 of the mask 2.

In the following description, embodiments of photonic crystals having different dielectric materials and lattice shapes and forming the light-shielding area 3 of the mask 2 will be introduced. In the following embodiments, the photonic crystal comprises a plurality of photonic crystal cells, each of which is disposed in a specific shape, has a surface receiving the light, and comprises a first dielectric and a second dielectric. The lattice constant of the photonic crystal is indicated as "a", the permittivity of the first dielectric is indicated as "$\in_1$", and the permittivity of the second dielectric is indicated as "$\in_2$". The light-shielding area 3 will shield off a light when a ratio of the lattice constant "a" to the wavelength "$\lambda$" of the light is a specific value within a band gap of the photonic crystal.

Figure 2A:
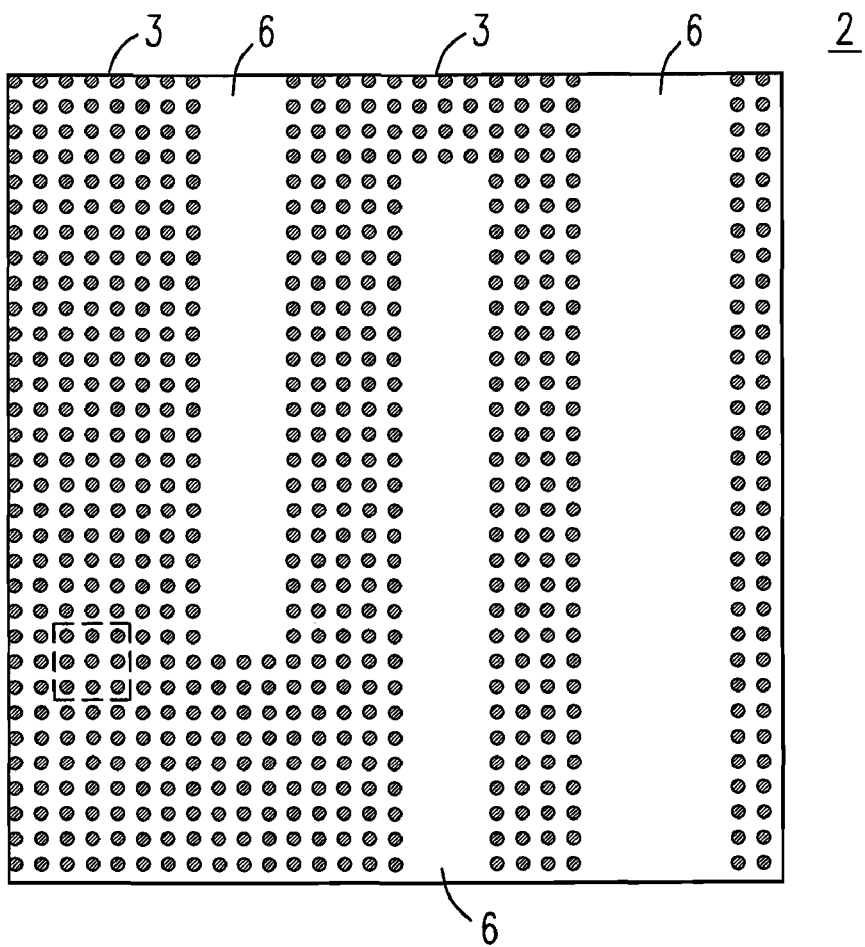
FIG. 2(A) is a vertical view of a mask according to an embodiment of the present preferred embodiment.
Figure 2B:
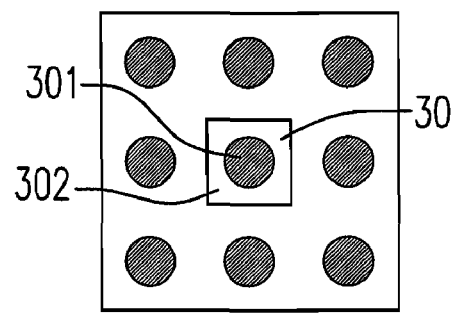
FIG. 2(B) is an amplified diagram showing a portion of the light-shielding area in FIG. 2(A)

Please refer to FIG. 2(A) showing a vertical view of a mask according to an embodiment of the present preferred embodiment and FIG. 2(B) showing an amplified portion of the light-shielding area in FIG. 2(A). The mask 2 comprises the light-shielding area 3 and the light-passing area 6, wherein the light-shielding area 3 are formed by a plurality of photonic crystal cells 30 disposed in square lattices to constitute a cylindrical photonic crystal system. In FIG. 2(B), there are nine photonic crystal cells 30 each having a surface receiving the exposing light 40 and comprising a first dielectric 301 and a second dielectric 302. The first dielectric 301 is cylindrical, and the second dielectric 302 surrounds the first dielectric 301 to form each photonic crystal cell 30 having a square-shaped surface. If the length of a side of each square-shaped surface is "a", which is the lattice constant of the plurality of photonic crystal cells 30, and the radius of the top surface of the cylinder is "$r_a$", we can use Maxwell's Equations to get the respective wave equations for the electric field (E) and magnetic field (M). Employing Bloch's theorem and the plane wave expansion method, a photonic frequency band diagram of the photonic crystal will be obtained. The equations employed are introduced as follows, for example:

$$\frac{1}{\varepsilon(\vec{G})} = \sum_{\vec{G}} \kappa(\vec{G}) e^{i\vec{G}\cdot\vec{r}}$$

$$\kappa(\vec{G}) = 2f\left(\frac{1}{\varepsilon_1} - \frac{1}{\varepsilon_2}\right)\frac{J_1(Gr_a)}{Gr_a}, \text{ for } G \neq 0$$

$$\kappa(\vec{G}) = \frac{f}{\varepsilon_1} - \frac{1-f}{\varepsilon_2}, \text{ for } G = 0$$

$$\text{where } f = \frac{\pi r_a^2}{V_0}, V_0 = a^2$$

G: reciprocal lattice vector
f: volume fraction
$\kappa(\vec{G})$: structure factor Apply the above formulas to the following equations:

$$-\frac{1}{\varepsilon(\vec{r_{//}})}\left(\frac{\partial^2}{\partial x^2} + \frac{\partial^2}{\partial y^2}\right) E_z(\vec{r_{//}}) = \frac{\omega^2}{c^2} E_z(\vec{r_{//}})$$

$$-\left(\frac{\partial}{\partial x}\frac{1}{\varepsilon(\vec{r_{//}})}\frac{\partial}{\partial x} + \frac{\partial}{\partial y}\frac{1}{\varepsilon(\vec{r_{//}})}\frac{\partial}{\partial y}\right) H_z(\vec{r_{//}}) = \frac{\omega^2}{c^2} H_z(\vec{r_{//}})$$

ω: frequency
c: light speed
k: wave number
E: Electric Field
H: Magnetic Field

Figure 2C:
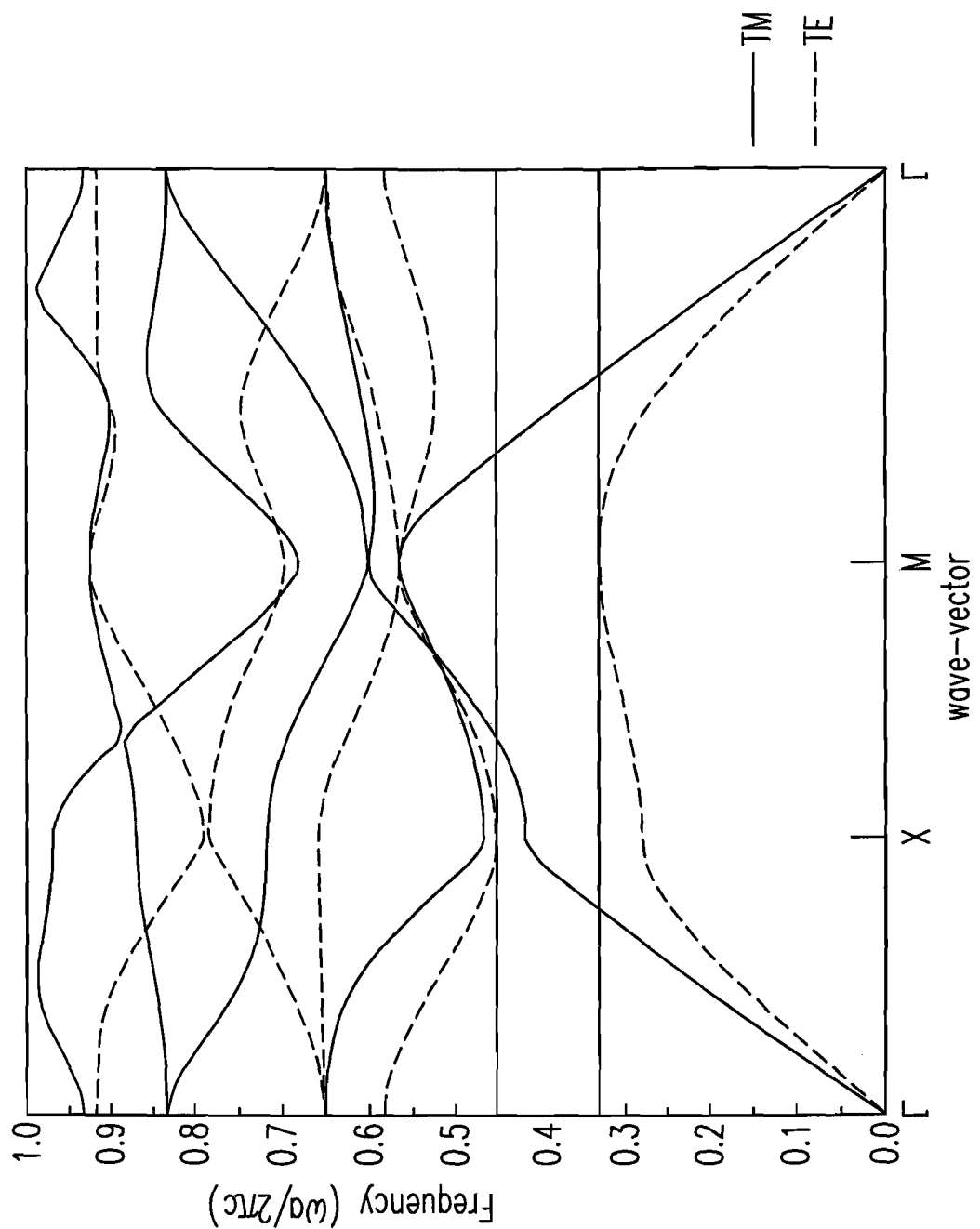
FIG. 2(C) is a diagram showing a band structure of the photonic crystal in FIG. 2(A)

When a ratio of the lattice constant "a" to the radius "$r_a$", and the respective values of $\in_1$ and $\in_2$ are predefined, a photonic frequency band diagram of the photonic crystal in FIGS. 2(A) and 2(B) will be obtained via the mentioned theorems and equations. Please refer to FIG. 2(C), showing a band structure diagram of the photonic crystal in FIGS. 2(A) and 2(B). In this embodiment, the value of $\in_1$ is 8.9, $\in_2$ is 1.0 and $r_a$ is 0.2a, and there is a band gap to a TE wave as the band structure diagram in FIG. 2(C) shows. Therefore, if a ratio of "a" to a wavelength "λ" of a TE wave is in a range of 0.3301 to 0.451, the TE wave will be shielded off by the light-shielding area 3 formed by the plurality of photonic crystal cells 30.

Figure 3A:
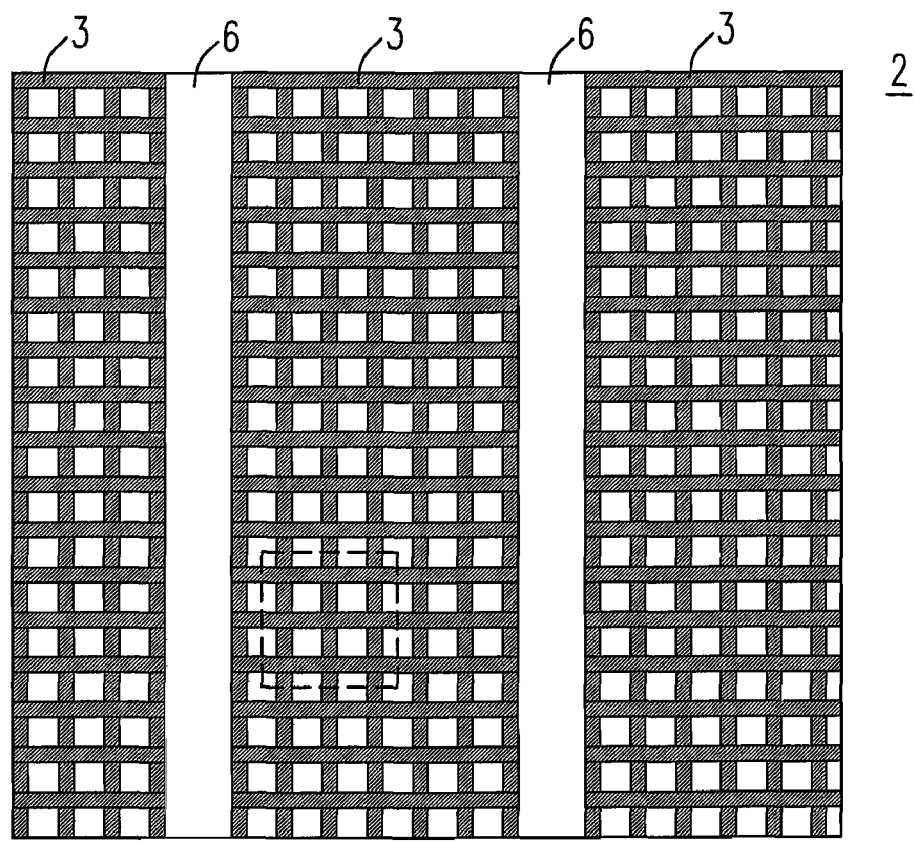
FIG. 3(A) is a vertical view of a mask according to another embodiment of the present preferred embodiment.
Figure 3B:
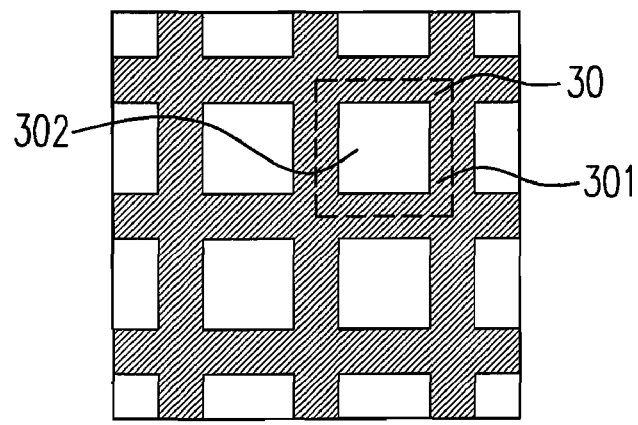
FIG. 3(B) is an amplified diagram showing a portion of the light-shielding area in FIG. 3(A)
Figure 3C:
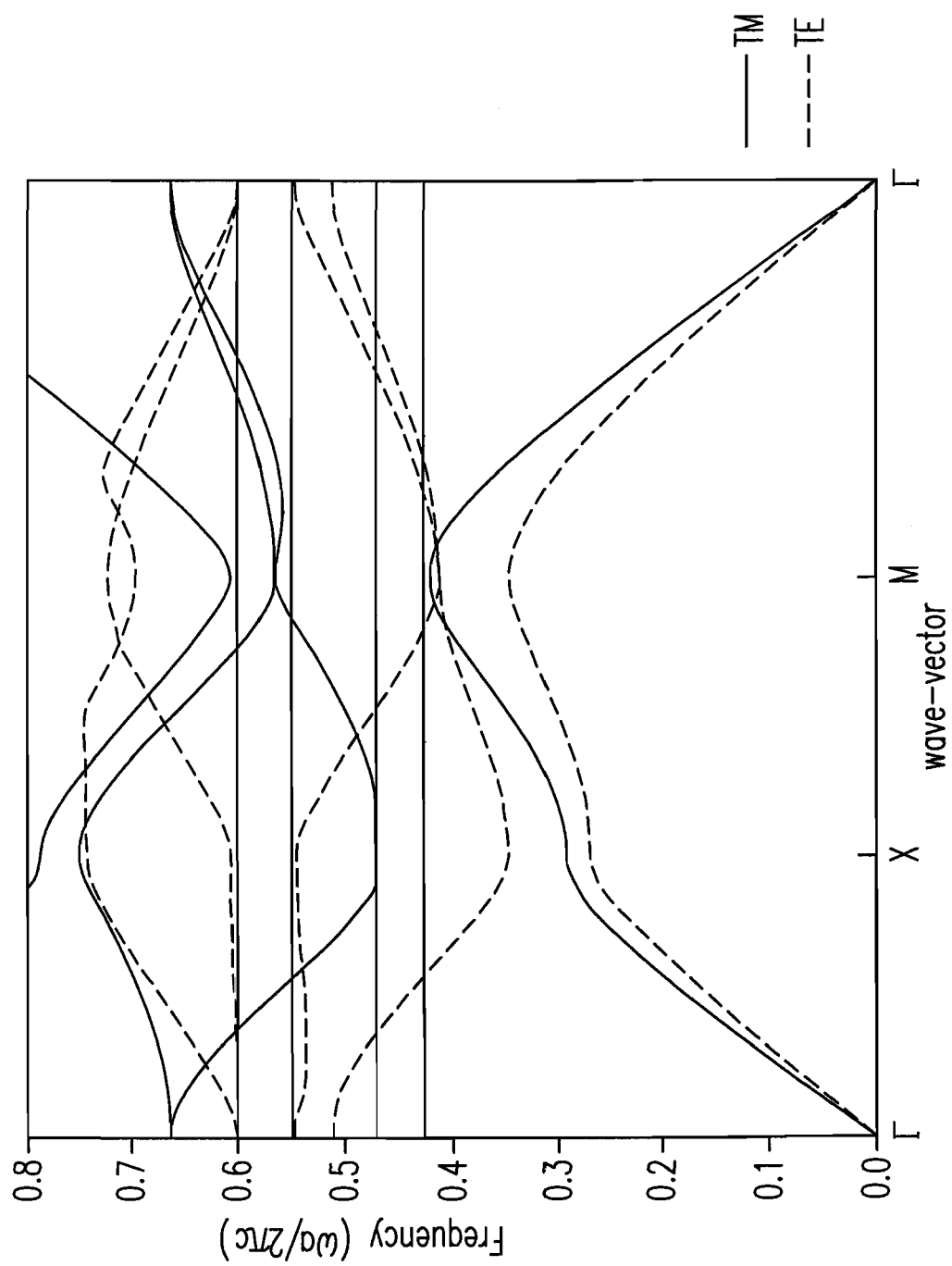
FIG. 3(C) is a diagram showing a band structure of the photonic crystal in FIG. 3(A)

Please refer to FIG. 3(A) showing a vertical view of a mask according to another embodiment of the present preferred embodiment and FIG. 3(B) showing an amplified portion of the light-shielding area in FIG. 3(A). The mask 2 comprises the light-shielding area 3 and the light-passing area 6, wherein the light-shielding area 3 are formed by a plurality of photonic crystal cells 30 disposed in rectangular lattices to constitute a checker photonic crystal system. Each photonic crystal cell 30 has a rectangular surface receiving the exposing light 40 and comprises a first dielectric 301 and a second dielectric 302. The second dielectric 302 is a rectangle with a length of "b" and a width of "a", which is the lattice constant of the photonic crystal in the mentioned embodiment. The first dielectric 301 comprises four cuboids and surrounds the second dielectric 302 to form each photonic crystal cell 30 having a rectangular-shaped surface, which has a length of "d1" and a width of "d2". Based on similar theorems and equations employed in the first embodiment, when the value of $\in_1$ is 8.9, $\in_2$ is 1.0, d1=d2, a=b and d2/a=2.85/2.5, a photonic frequency band diagram of the photonic crystal in FIGS. 3(A) and 3(B) will be obtained. Please refer to FIG. 3(C), showing a band structure diagram of the photonic crystal in FIGS. 3(A) and 3(B). In this embodiment, there is a band gap to a TE wave and another band gap for a TM wave. Therefore, if a ratio of "a" to a wavelength "λ" of a TE wave is in a range of 0.5455 to 0.5988, the TE wave will be shielded off by the light-shielding area 3 formed by the plurality of photonic crystal cells 30; if a ratio of "a" to a wavelength "λ" of a TM wave is in a range of 0.4212 to 0.4642, the TM wave will be shielded off by the light-shielding area 3.

Figure 4A:
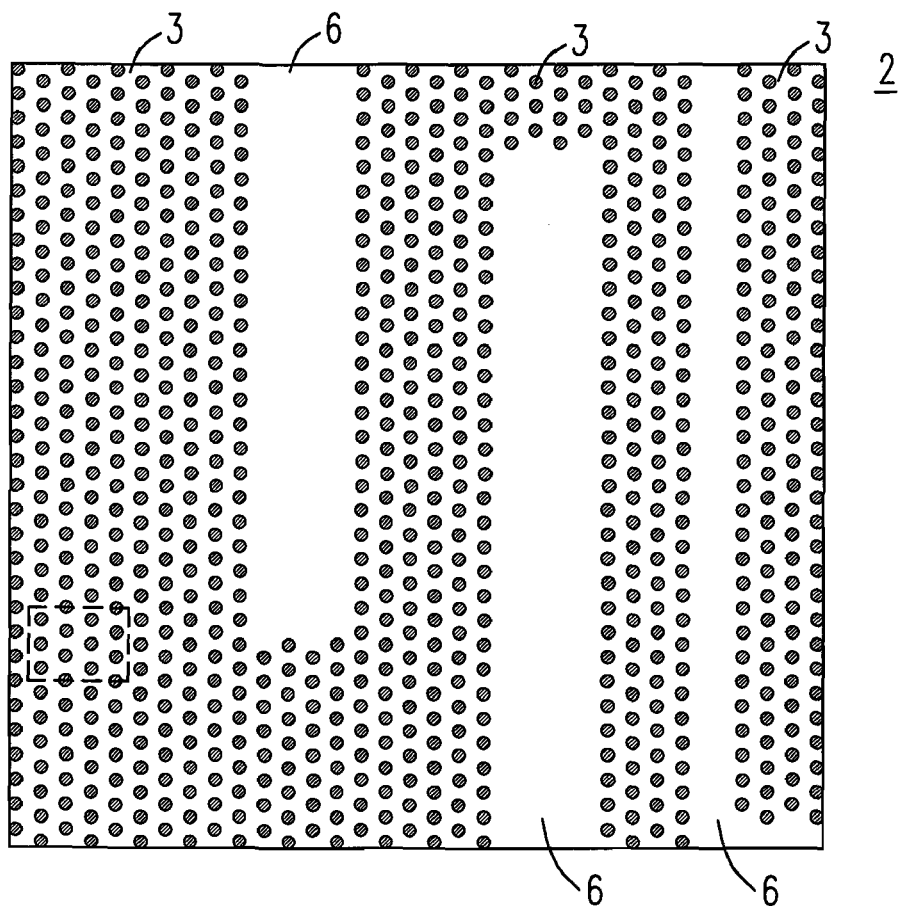
FIG. 4(A) is a vertical view of a mask according to a further embodiment of the present preferred embodiment.
Figure 4B:
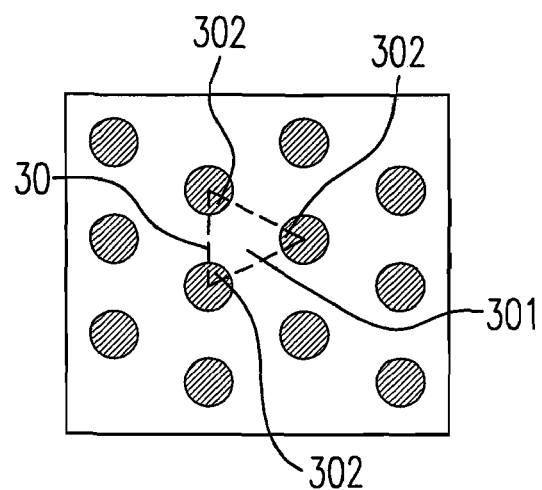
FIG. 4(B) is an amplified diagram showing a portion of the light-shielding area in FIG. 4(A)

Please refer to FIG. 4(A) showing a vertical view of a mask according to a further embodiment of the present preferred embodiment and FIG. 4(B) showing an amplified portion of the light-shielding area in FIG. 4(A). The mask 2 comprises the light-shielding area 3 and the light-passing area 6, wherein the light-shielding area 3 are formed by a plurality of photonic crystal cells 30 disposed in triangular lattices to constitute a cylindrical photonic crystal system. Each photonic crystal cell 30 has a triangular surface receiving the exposing light 40 and comprises a first dielectric 301 and a second dielectric 302. The second dielectrics 302 form a plurality of cylinders, the radius of the top surface of the cylinder is "$r_a$", and the length of the side of the each triangular-shaped surface is "a", which is the lattice constant of the photonic crystal in this embodiment. Based on similar theorems and equations employed in the first embodiment, when the value of $\in_1$ is 11.4, $\in_2$ is 1.0, and $r_a$/a=0.45, a photonic frequency band diagram of the photonic crystal in FIGS. 4(A) and 4(B) will be obtained.

Figure 4C:
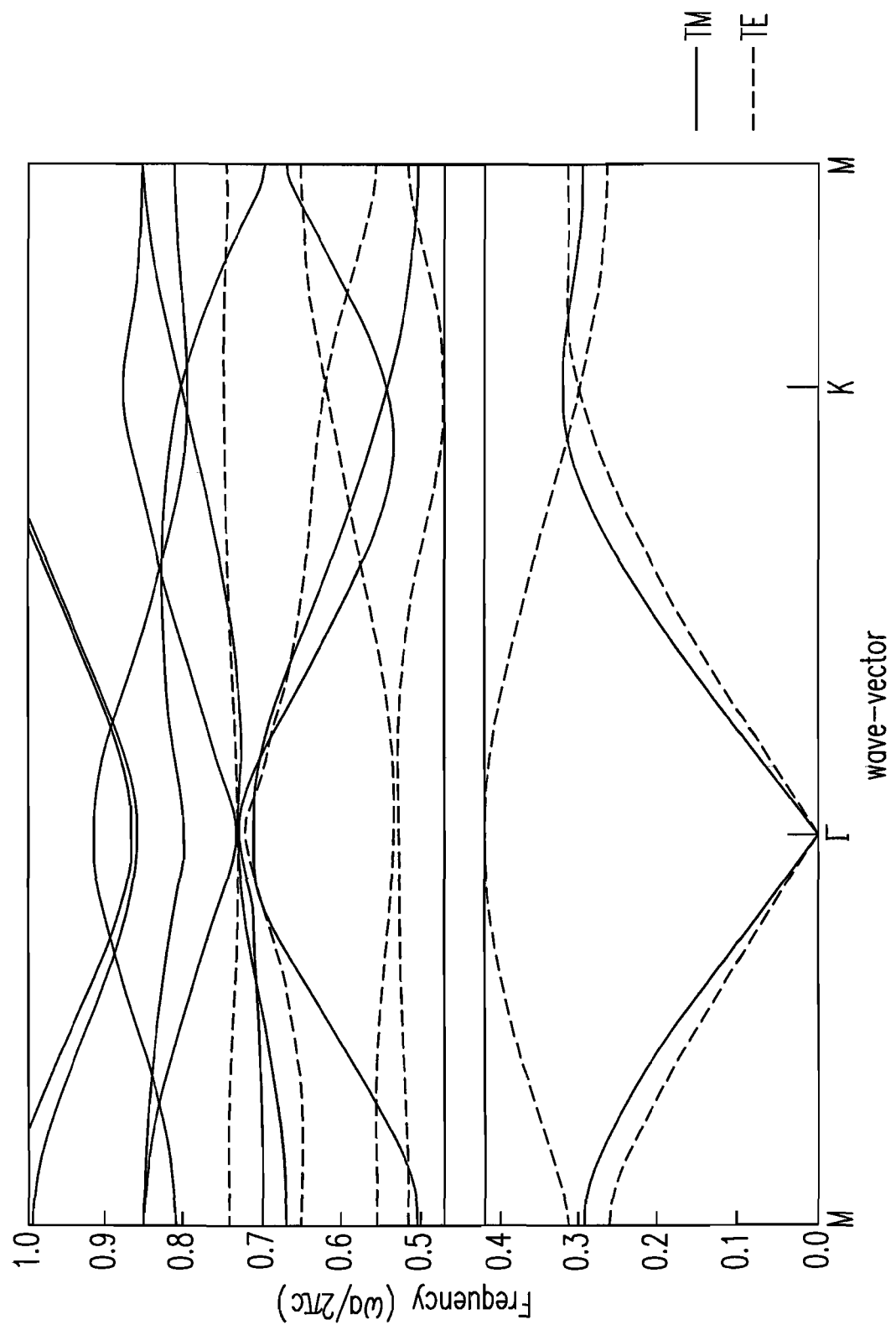
FIG. 4(C) is a diagram showing a band structure of the photonic crystal in FIG. 4(A)

Please refer to FIG. 4(C), showing a band structure diagram of the photonic crystal in FIGS. 4(A) and 4(B). In this embodiment, there is a common band gap for a TE wave and a TM wave, and another band gap for a TM wave. Therefore, if a ratio of "a" to a wavelength "λ" of a light, either of a TE wave and a TM wave, is in a range of 0.4207 to 0.4709, the light will be shielded off by the plurality of photonic crystal cells 30; if a ratio of "a" to a wavelength "λ" of a TM wave is in a range of 0.3213 to 0.5049, the TM wave will be shielded off by the light-shielding area 3 formed by the plurality of photonic crystal cells 30.

Figure 5A:
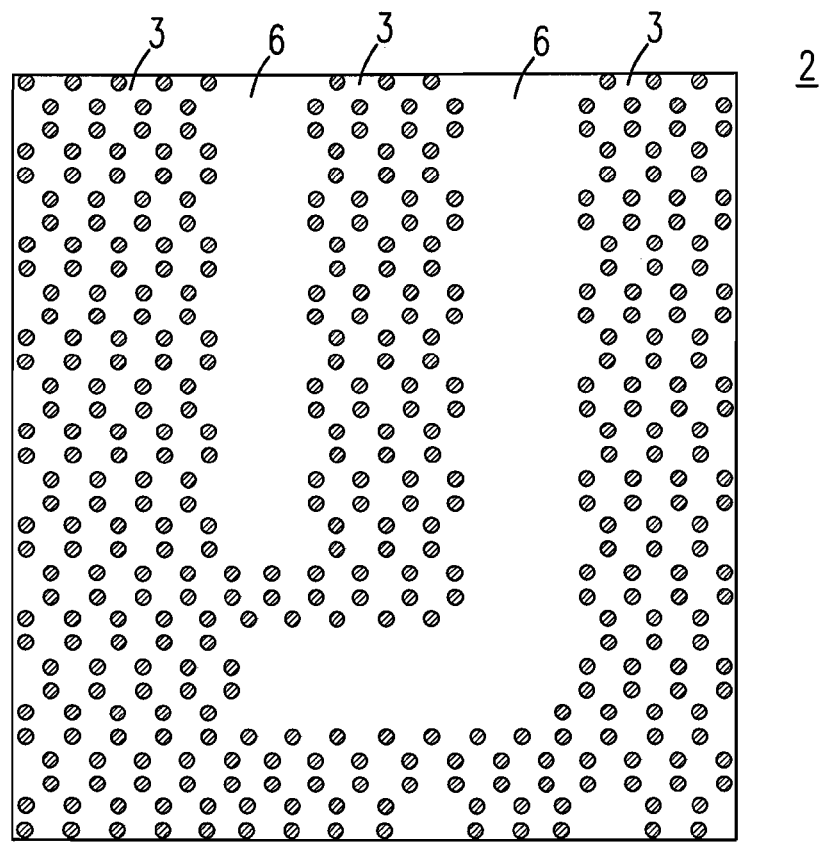
FIG. 5(A) is a vertical view of a mask according to a further embodiment of the present preferred embodiment.
Figure 5B:
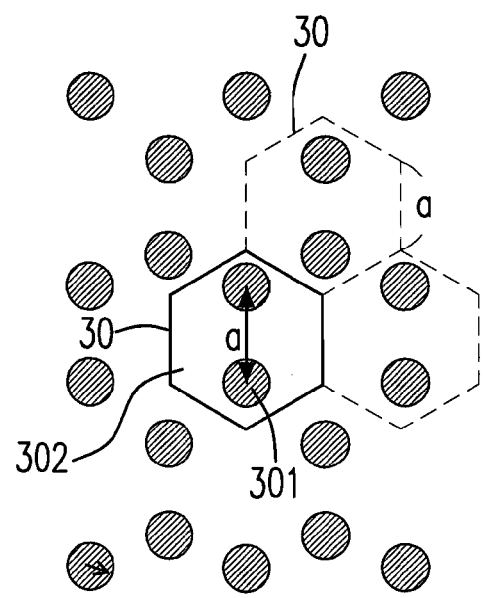
FIG. 5(B) is an amplified diagram showing a portion of the light-shielding area in FIG. 5(A)

Please refer to FIG. 5(A) showing a vertical view of a mask according to a further embodiment of the present preferred embodiment and FIG. 5(B) showing an amplified portion of the light-shielding area 3 in FIG. 5(A). The mask 2 comprises the light-shielding area 3 and the light-passing area 6, wherein the light-shielding area 3 are formed by a plurality of photonic crystal cells 30 disposed in hexagon-shaped lattices to constitute a cylindrical photonic crystal system. Each photonic crystal cell 30 has a hexagonal surface receiving the exposing light 40 and comprises a first dielectric 301 and a second dielectric 302. The first dielectrics 301 form a plurality of cylinders, the radius of the top surface of the cylinder is "$r_a$", and the length of the side of the each hexagonal surface is "a", which is the lattice constant of the photonic crystal in this embodiment. Furthermore, there are two cylinders disposed in each hexagon-shaped lattice, and the length between the centers of the two cylinders is equal to "a". Based on similar theorems and equations employed in the first embodiment, when the value of $\in_1$ is 13.0, $\in_2$ is 1.0, and $r_d/a$=0.2875, a photonic frequency band diagram of the photonic crystal in FIGS. 5(A) and 5(B) will be obtained.

Figure 5C:
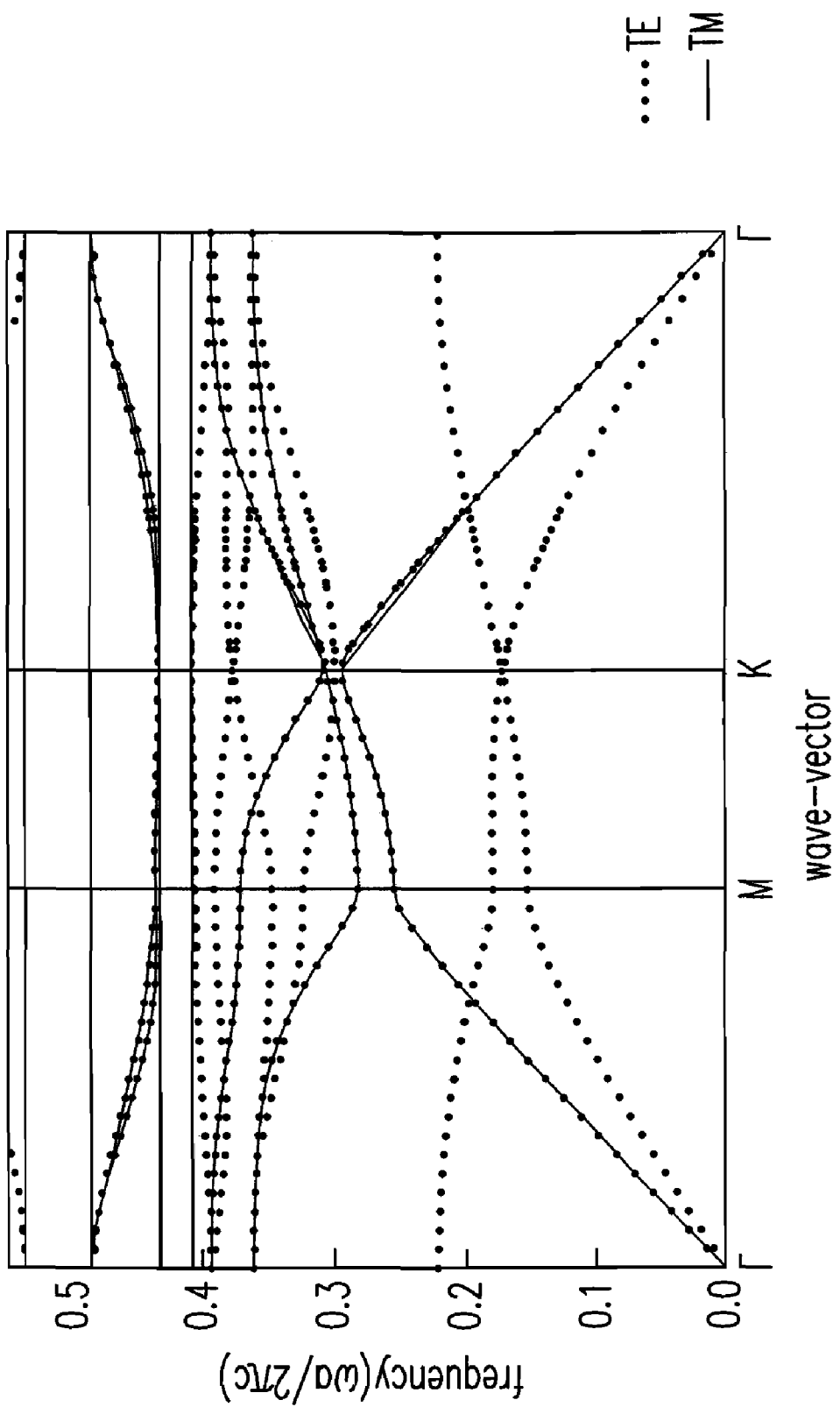
FIG. 5(C) is a diagram showing a band structure of the photonic crystal in FIG. 5(A)

Please refer to FIG. 5(C), showing a band structure diagram of the photonic crystal in FIGS. 5(A) and 5(B). In this embodiment, there are two common band gaps for a TE wave and a TM wave. Therefore, if a ratio of "a" to a wavelength "λ" of a light, either a TE wave or a TM wave, is in a range selected from one of 0.4088~0.4322 and 0.4886~0.5346, the light will be shielded by the light-shielding area 3 formed by the plurality of photonic crystal cells 30.

In the mentioned embodiments, the first dielectric 301 is a material having natural lattice structure, and the second dielectric 302 is air. In the embodiment of FIG. 2(A), the first dielectric 301 is disposed periodically and in a cylindrical shape on the surface 200 of the substrate 20 of the mask 2. In the embodiment of FIG. 3(A), the first dielectric 301 is disposed periodically and in a rectangular shape on the surface 200. In the embodiment of FIG. 4(A), the plurality of cylindrical second dielectrics 302 are formed by periodically punching the first dielectrics 301 having ~1 of 11.4.

In the mentioned embodiments, the first dielectric 301 is one selected from a group consisting of a metal, a silicon and a combination thereof, and the second dielectric 302 is air. However, it is to be noted that any two different materials, each having respective permittivity and periodically disposed to form a photonic crystal having a band gap, may be adopted to form the light-shielding area 3 of the mask 2 in the present preferred embodiment. Furthermore, the mask 2 of the mentioned embodiments is used for a photolithography process of a semiconductor element, wherein the exposing light 40 is an UV light in general, and the mask 2 provided in the present preferred embodiment may be used for a photolithography process using an Extreme Ultra-Violet light (EUV, having a wavelength of 13.4 nanometers) as an exposing light.

Figure 6:
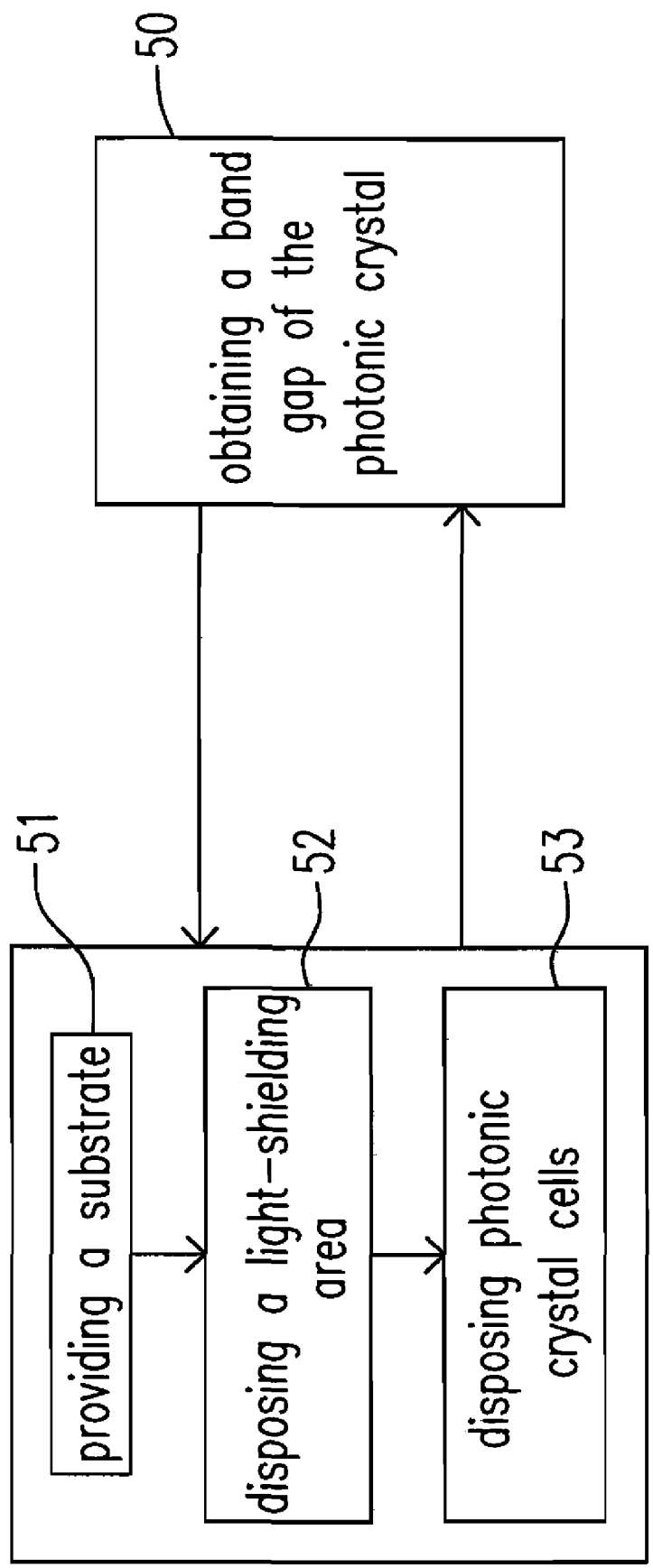
FIG. 6 is a diagram showing a flow chart of a method for designing a mask according to an embodiment of the present preferred embodiment.

Please refer to FIG. 6, showing a flow chart of a method for designing a mask according to an embodiment of the present preferred embodiment. First, a substrate is provided (step 51), such as a quartz glass, and a light-shielding area is disposed on the substrate (step 52). In the step 52, a pattern on the mask to be transferred to an element is designed, for example, a circuit pattern to be transferred to an IC chip is designed as the light-shielding area of the mask. Then, a plurality of photonic crystal cells are disposed in the light-shielding area (step 53), wherein each of the photonic crystal cells has a specific shape. That is to say, a photonic crystal is used to form the light-shielding area in the method for designing a mask in the present preferred embodiment.

According to the mentioned embodiment, the specific shape is one selected from a group consisting of a cube, a parallelepiped, a hexagonal prism and a triangular prism. Furthermore, the photonic crystal formed by the plurality of photonic crystal cells has a lattice constant. When a ratio of the lattice constant to a wavelength of a light is a specific value within a band gap of the photonic crystal, the light will be shielded off by the light-shielding area.

Therefore, the method according to the mentioned embodiment may further comprise a step of obtaining a band gap of the plurality of photonic crystal cells (step 50). The step 50 may be carried out either before or after the step 53. The ratio of a lattice constant to a wavelength of a light shielded off by the light-shielding area is obtained from step 50, and if the wavelength is preset, the lattice constant can be defined based on the band gap and the wavelength. Alternatively, if the lattice constant is predefined, the wavelength of the light can be set based on the band gap and the lattice constant.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A mask comprising a light-shielding area for shielding light and a light passing area to allow the light to pass therethrough, the light-shielding area having a plurality of photonic crystals with a lattice constant, and a ratio of the lattice constant to a wavelength of the light being a specific value within a band gap of the photonic crystal, wherein the photonic crystal includes a plurality of photonic crystal cells, each of which has a rectangular- or hexagonal-shaped surface receiving the light and includes a first dielectric and a second dielectric, the first dielectric includes four cuboids forming a frame surrounding the second dielectric when the surface is rectangular-shaped, and the first dielectric includes two cylinders when the surface is hexagonal-shaped.

2. The mask according to claim 1, wherein when the surface is rectangular-shaped and the light is a TE wave, the specific value is in a range of 0.5455 to 0.5988.

3. The mask according to claim 1, wherein when the surface is rectangular-shaped and the light is a transverse magnetic (TM) wave, the specific value is in a range of 0.4212 to 0.4642.

4. The mask according to claim 1, wherein when the surface is hexagonal-shaped, the specific value is in a range selected from one of 0.4088 to 0.4322 and 0.4886 to 0.5364.

5. The mask according to claim 1, wherein the first dielectric is one selected from a group consisting of a metal, a silicon and a combination thereof.

6. The mask according to claim 5, wherein the second dielectric is air.

7. The mask according to claim 1, which is used for a photolithography process of a semiconductor element, wherein the light is an Extreme Ultra-Violet light.

8. A mask comprising a light-shielding area, wherein the light-shielding area comprises a plurality of photonic crystal cells, each of which has a rectangular- or hexagonal-shaped light receiving surface and includes a first dielectric and a second dielectric, the first dielectric includes four cuboids forming a frame surrounding the second dielectric when the surface is rectangular-shaped, and the first dielectric includes two cylinders when the surface is hexagonal-shaped.

9. A method for designing a mask, comprising:
providing a substrate;
disposing a light-shielding area on the substrate; and
disposing a plurality of photonic crystal cells in the light-shielding area for shielding light, wherein each of the photonic crystal cells has a rectangular- or hexagonal-shaped surface receiving the light and includes a first dielectric and a second dielectric, the first dielectric includes four cuboids forming a frame surrounding the second dielectric when the surface is rectangular-shaped, and the first dielectric includes two cylinders when the surface is hexagonal-shaped.

10. The method according to claim 9, wherein the photonic crystal cells have a lattice constant, and a ratio of the lattice constant to a wavelength of the light is a specific value within a band gap of the photonic crystal cells.

* * * * *